(12) United States Patent
Costa et al.

(10) Patent No.: US 10,523,190 B2
(45) Date of Patent: Dec. 31, 2019

(54) PULSE DENSITY MODULATION ADJUSTMENT

(71) Applicant: Infineon Technologies AG, Neubiberg (DE)

(72) Inventors: Pedro Costa, Munich (DE); Ketan Dewan, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 130 days.

(21) Appl. No.: 15/824,345

(22) Filed: Nov. 28, 2017

(65) Prior Publication Data

US 2019/0165775 A1 May 30, 2019

(51) Int. Cl.
*H03K 7/04* (2006.01)
*H03L 7/081* (2006.01)

(52) U.S. Cl.
CPC ............. *H03K 7/04* (2013.01); *H03L 7/0812* (2013.01)

(58) Field of Classification Search
CPC ...................................................... H03K 7/04
USPC ......................................................... 332/112
See application file for complete search history.

(56) References Cited

U.S. PATENT DOCUMENTS

| 6,317,457 | B1* | 11/2001 | Naruse | H04B 14/02 375/237 |
| 6,563,393 | B2* | 5/2003 | Zhang | H03M 7/00 332/106 |
| 2005/0057319 | A1* | 3/2005 | Maunuksela | H03K 5/133 332/106 |
| 2012/0288044 | A1* | 11/2012 | Roberts | G06F 1/022 375/350 |

OTHER PUBLICATIONS

Infineon Technologies AG, U.S. Appl. No. 15/497,644, filed Apr. 26, 2017.

* cited by examiner

*Primary Examiner* — Joseph Chang
(74) *Attorney, Agent, or Firm* — Schiff Hardin LLP

(57) ABSTRACT

A modulator having a pulse density modulator configured to generate from bit stream information a Pulse Density Modulation (PDM) stream based on a PDM clock; and a bit stream adjuster configured to divide the PDM clock into a PDM multi-phase clock, adjust a duration of at least one pulse of the generated PDM stream by selecting a PDM clock phase of the PDM multi-phase clock for sampling the generated PDM stream, and output an adjusted PDM stream.

17 Claims, 3 Drawing Sheets

PULSE DENSITY MODULATION ADJUSTMENT

BACKGROUND

A Voltage Controlled Oscillator (VCO) is an oscillator whose oscillation frequency is controlled by an applied input voltage. The more accurate the applied input voltage input, the more accurate the oscillation frequency.

VCO oscillation frequencies are used in radar systems, such as Advanced Driver Assistance Systems (ADAS), to generate high frequency modulation pulses. The accuracy of the oscillation frequencies from the VCO impacts the radar system accuracy.

The VCO's analog input voltage may have decreased accuracy due to low resolution, ageing, and/or temperature variations. Further, an increase in switching activity for control of the applied input voltage leads to an increase in radar system noise.

A more accurate control of the VCO is desired, but without additional cost or system noise.

DETAILED DESCRIPTION

The present disclosure is directed to a modulator comprising a bit stream adjuster configured to divide a PDM clock into a PDM multi-phase clock, adjust a duration of at least one pulse of a PDM stream by selecting a PDM clock phase of the PDM multi-phase clock for sampling the generated PDM stream, and output an adjusted PDM stream, wherein the adjusted PDM stream has a higher resolution than the generated PDM bit stream. This modulator increases the resolution of the PDM stream without increasing frequency of operation.

Figure 1A:
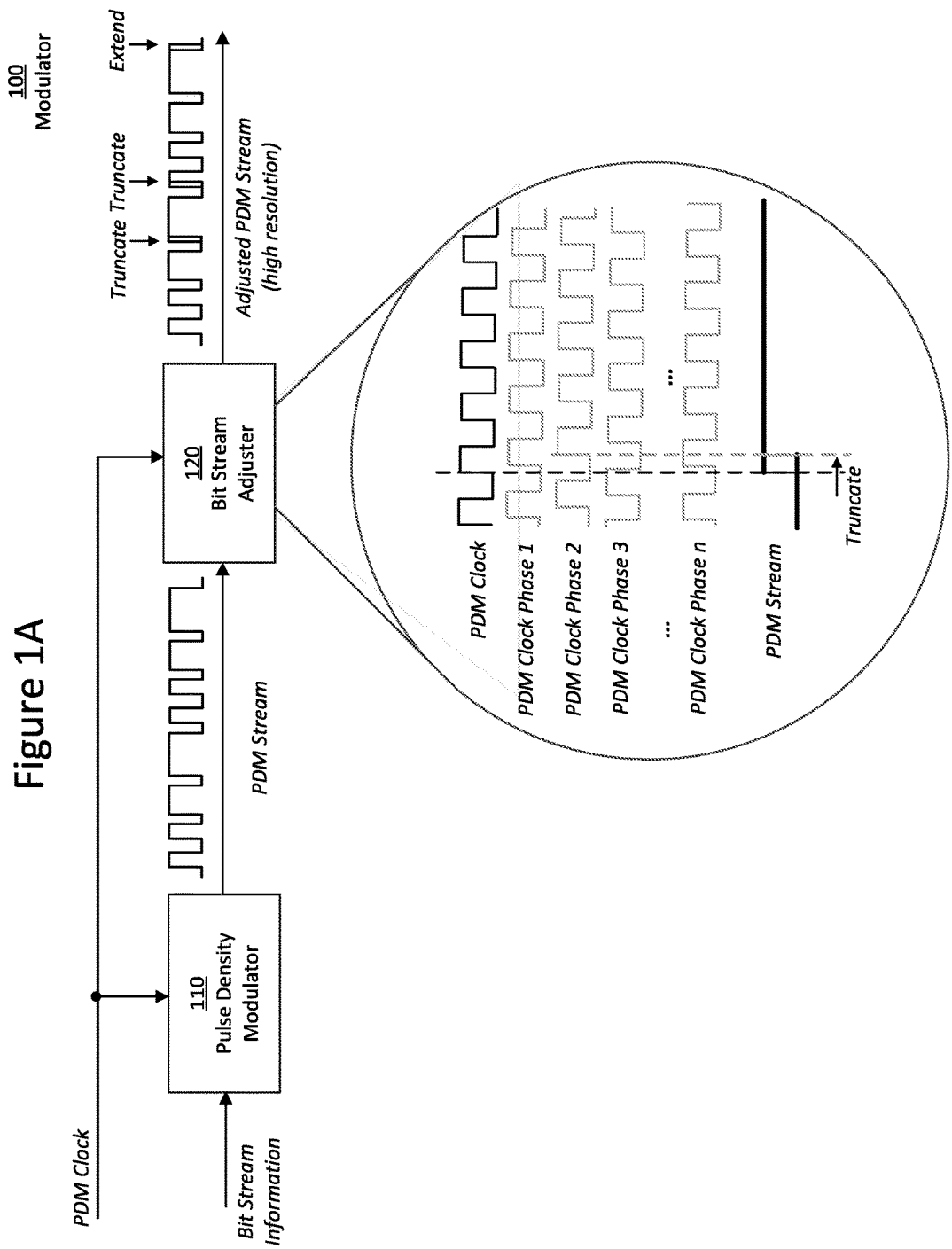
FIG. 1A illustrates a schematic diagram of a modulator in accordance with an aspect of the disclosure.

FIG. 1A illustrates a schematic diagram of a modulator 100 in accordance with an aspect of the disclosure.

The modulator 100 comprises a pulse density modulator 110 and a bit stream adjuster 120.

The pulse density modulator 110 is configured to generate, from bit stream information, a Pulse Density Modulation (PDM) stream based on a PDM clock.

The bit stream adjuster 120 is configured to divide the PDM clock into a PDM multi-phase clock, adjust a duration of at least one pulse of the generated PDM stream by selecting a PDM clock phase of the PDM multi-phase clock for sampling the generated PDM stream, and output an adjusted PDM stream. Adjusting a duration of the at least one pulse of the generated PDM bit stream means truncating or extending the duration of the at least one pulse.

The adjusted PDM stream from the bit stream adjuster 120 has a higher resolution than the generated PDM bit stream from the pulse density modulator 110. For example, the bit stream adjuster 120 is configured to convert a pulse that lasts 100 ns to a pulse that lasts 100.5 ns (extended) or 99.4 ns (truncated). This is accomplished without using a high-speed clock, for example, a 1 GHz clock.

This adjustment to the pulse results in the voltage to a Voltage Controlled Oscillator (VCO) being controlled with a higher accuracy, thus enabling the VCO to generate a more accurate output oscillation frequency. At the same time, this higher accuracy adjustment can be used to compensate for process variations, ageing, and/or temperature variations.

Further, the bit stream adjuster 120 is configured to operate at a frequency that is less than or equal to a frequency of the pulse density modulator 110. This is because the bit stream adjuster 120 only needs to truncate or extend, a single pulse, and then can select a new truncate/extend value for a next pulse. As a result, switching activity and introduction of additional noise is minimized.

Figure 1B:
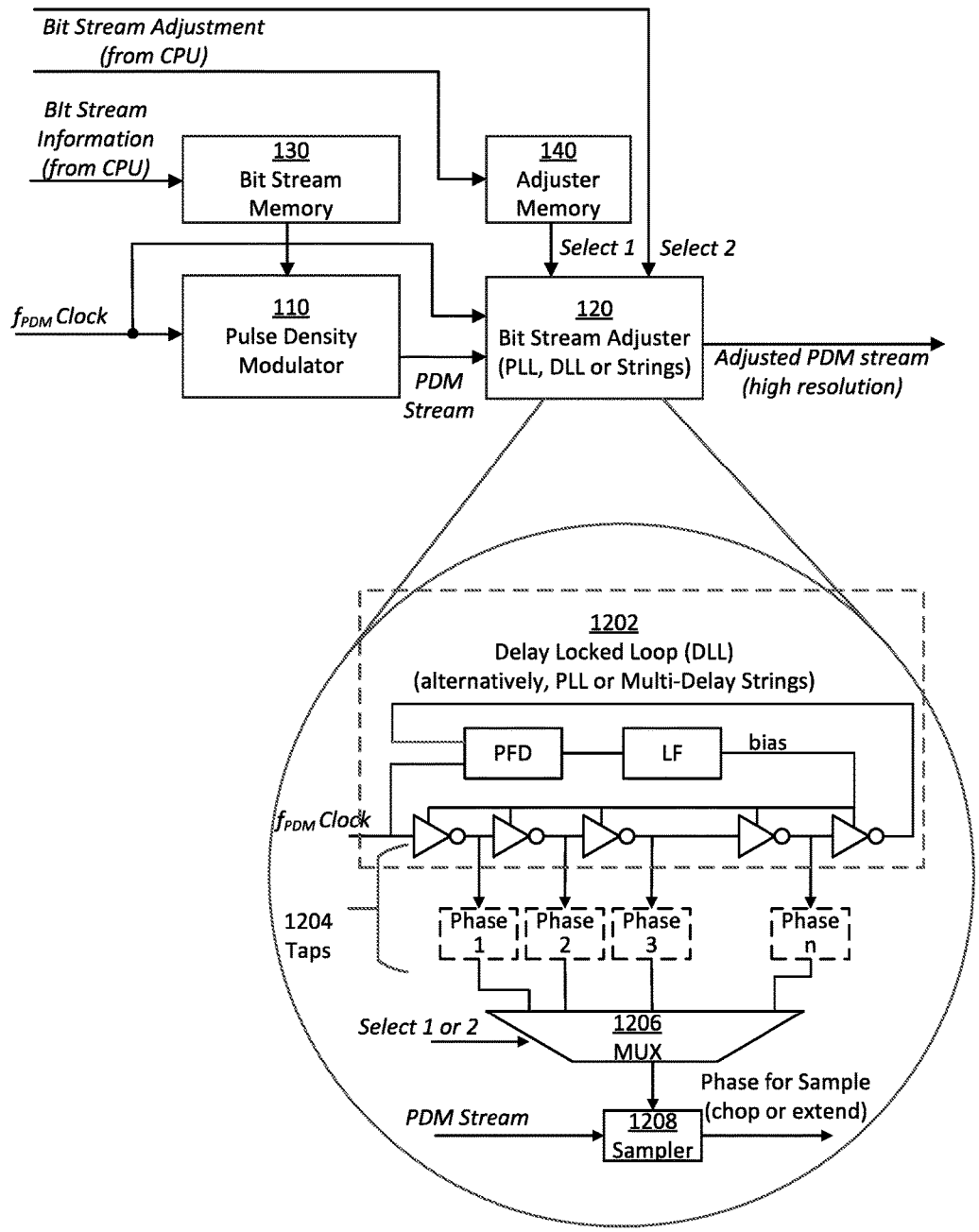
FIG. 1B illustrates a schematic diagram of the modulator of FIG. 1A shown in greater detail.

FIG. 1B illustrates a schematic diagram of the modulator 100 of FIG. 1A shown in greater detail. The modulator 100 may additionally comprise a bit stream memory 130 and an adjuster memory 140.

As discussed above, the pulse density modulator 110 is configured to generate a PDM stream. The bit stream memory 130 is configured to store the bit stream information received from, for example, a Central Processing Unit (CPU). The pulse density modulator 110 then uses the stored bit stream information to generate the PDM stream with an accuracy based on a received PDM clock $f_{PDM}$.

The bit stream adjuster 120 is configured to adjust (i.e., truncate or extend) each pulse or a combination of pulses of the PDM stream by a selected PDM clock phase.

The bit stream adjuster 120 comprises a multi-phase Delay Locked Loop (DLL) 1202, taps 1204, a multiplexer 1206, and a sampler 1208.

The multi-phase DLL 1202 is configured to divide the received PDM clock $f_{PDM}$ into the PDM multi-phase clock. The multi-phase DLL 1202 shown comprises a Phase Frequency Detector (PFD), a Loop Filter (LF), which outputs a bias voltage, and a series of inverters. Alternatively, the multi-phase DLL 1202 may be replaced with a multi-phase Phase Locked Loop (PLL) or multi-delay strings, also configured to divide the PDM clock into the PDM multi-phase clock. Multi-phase DLLs 1202, PLLs, and multi-delay strings are known, and for the sake of brevity, their descriptions will be omitted here.

The taps 1204 are configured to tap respective phases (i.e., phase 1 . . . Phase n) from the multi-phase DLL 1202 to respective inputs of the multiplexer 1206.

The multiplexer 1206 is configured to output the selected PDM clock phase based on a PDM phase select signal, either "Select 1" from the adjuster memory 140 or "Select 2" from the CPU, for example. More specifically, the adjuster memory 140 is configured to store the PDM clock phase to be selected. The PDM clock phase may be selected from the adjuster memory 140 by a logic circuit (not shown), and input to the bit stream adjuster 120 via a select signal ("Select 1"). Alternatively, the PDM clock phase to be selected may be provided to the bit stream adjuster 120 directly by a processor or a software routine via a register and a select signal ("Select 2").

The sampler 1208 is configured to sample the generated PDM bit stream, which is received from the pulse density modulator 110, at the selected PDM clock phase output from the multiplexer 1206, and output the adjusted PDM bit stream.

Figure 2:
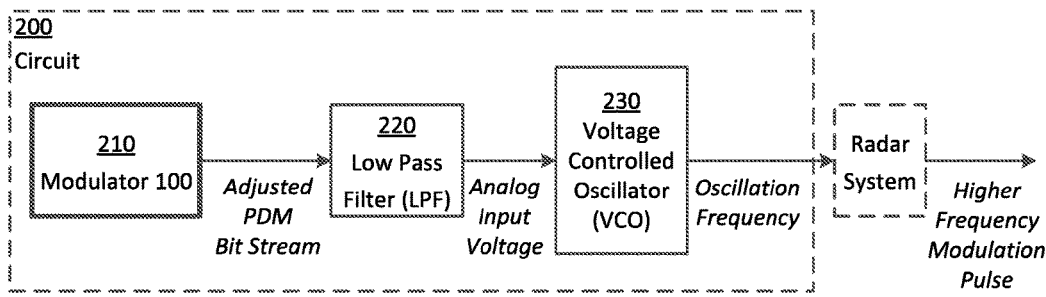
FIG. 2 illustrates a circuit comprising a modulator and a Voltage Controlled Oscillator (VCO) in accordance with an aspect of the disclosure.

FIG. 2 illustrates a circuit 200 comprising a modulator 210, a Low Pass Filter (LPF) 220, and a Voltage Controlled Oscillator (VCO) 230 in accordance with an aspect of the disclosure.

The modulator 210 is the modulator 100 of FIGS. 1A and 1B. The LPF 220 is configured to convert the adjusted PDM bit stream received from the modulator 210 to an analog input voltage. The VCO 230 is configured to be controlled based on the analog input voltage. The VCO 230 outputs an oscillation frequency, which may then be used by, for example, a radar system that generates a modulation pulse having a higher frequency.

Figure 3:
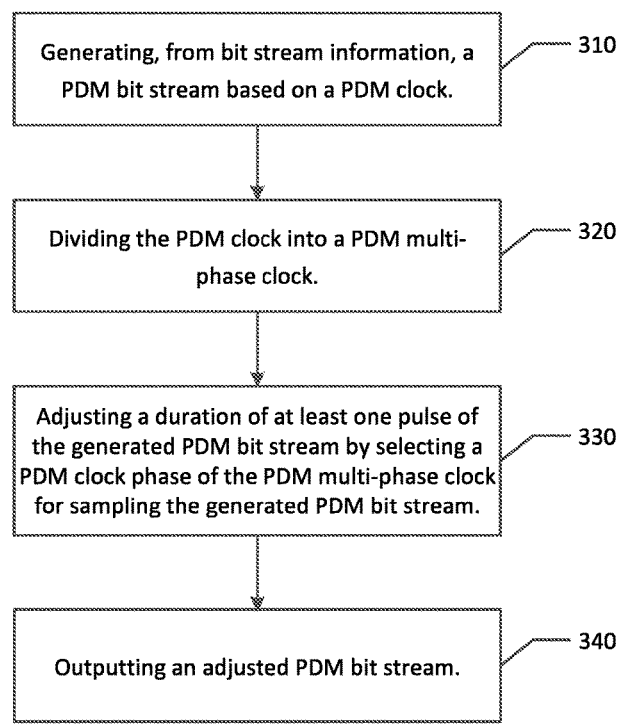
FIG. 3 illustrates a flowchart of a modulation method in accordance with an aspect of the disclosure.

FIG. 3 illustrates a flowchart 300 of a modulation method in accordance with an aspect of the disclosure.

At 310, a pulse density modulator 110 generates, from bit stream information, a PDM bit stream based on a PDM clock.

At 320, a bit stream adjuster 120 divides the PDM clock into a PDM multi-phase clock.

At 330, the bit stream adjuster 120 adjusts a duration of at least one pulse of the generated PDM bit stream by selecting a PDM clock phase of the PDM multi-phase clock for sampling the generated PDM bit stream. The bit stream adjuster 120 truncates or extends the duration of the at least one pulse of the generated PDM bit stream.

At 340, the bit stream adjuster 120 outputs an adjusted PDM bit stream, wherein the adjusted PDM bit stream has a higher resolution than the generated PDM bit stream.

The result pf the modulator and modulation method of this disclosure is a high resolution PDM stream generated by means of non-high speed logic. Each of the PDM pulses may be truncated or extended in a range of pico-seconds, which can then be used to generate a highly accurate voltage for a VCO.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A modulator, comprising:
   a pulse density modulator configured to generate from bit stream information a Pulse Density Modulation (PDM) stream based on a PDM clock; and
   a bit stream adjuster configured to divide the PDM clock into a PDM multi-phase clock, truncate or extend a duration of at least one pulse of the generated PDM stream by selecting a PDM clock phase of the PDM multi-phase clock for sampling the generated PDM stream, and output an adjusted PDM stream.

2. The modulator of claim 1, wherein the adjusted PDM stream has a higher resolution than the generated PDM bit stream.

3. The modulator of claim 1, wherein the bit stream adjuster comprises a multi-phase Delay Locked Loop (DLL) configured to divide the PDM clock into the PDM multi-phase clock.

4. The modulator of claim 1, wherein the bit stream adjuster comprises a multi-phase Phase Locked Loop (PLL) configured to divide the PDM clock into the PDM multi-phase clock.

5. The modulator of claim 1, wherein the bit stream adjuster comprises a series of inverters configured to divide the PDM clock into the PDM multi-phase clock.

6. The modulator of claim 1, wherein the bit stream adjuster comprises:
   a multiplexer configured to output the selected PDM clock phase based on a PDM phase select signal; and
   a sampler configured to sample the generated PDM bit stream at the selected PDM clock phase, and output the truncated or extended PDM bit stream.

7. The modulator of claim 1, wherein the pulse density modulator comprises a memory configured to store the bit stream information.

8. The modulator of claim 1, further comprising:
   a memory configured to store the PDM clock phase to be selected.

9. The modulator of claim 8, wherein the PDM clock phase to be selected is selected from the memory by a logic circuit.

10. The modulator of claim 1, wherein the PDM clock phase to be selected is provided to the bit stream adjuster directly by a processor.

11. The modulator of claim 1, wherein the PDM clock phase to be selected is provided to the bit stream adjuster by a software routine.

12. A circuit, comprising:
    the modulator of claim 1; and
    a Voltage Controlled Oscillator (VCO) configured to be controlled based on the adjusted PDM bit stream.

13. The circuit of claim 12, further comprising:
    a Low Pass Filter (LPF) configured to convert the adjusted PDM bit stream to an analog voltage for controlling the VCO.

14. A modulator, comprising:
    a pulse density modulator configured to generate from bit stream information a Pulse Density Modulation (PDM) stream based on a PDM clock; and
    a bit stream adjuster configured to divide the PDM clock into a PDM multi-phase clock, adjust a duration of at least one pulse of the generated PDM stream by selecting a PDM clock phase of the PDM multi-phase clock for sampling the generated PDM stream, and output an adjusted PDM stream,
    wherein the bit stream adjuster is configured to operate at a frequency that is less than or equal to a frequency of the pulse density modulator.

15. A modulation method, comprising:
    generating, by a pulse density modulator, from bit stream information, a Pulse Density Modulation (PDM) bit stream based on a PDM clock;
    dividing, by a bit stream adjuster, the PDM clock into a PDM multi-phase clock;
    truncating or extending, by the bit stream adjuster, a duration of at least one pulse of the generated PDM bit stream by selecting a PDM clock phase of the PDM multi-phase clock for sampling the generated PDM bit stream; and
    outputting, by the bit stream adjuster, an adjusted PDM bit stream,
    wherein the adjusted PDM bit stream has a higher resolution than the generated PDM bit stream.

16. The modulation method of claim 15, further comprising:
    outputting, by a multiplexer of the bit stream adjuster, the selected PDM clock phase based on a PDM phase select signal; and sampling, by a sampler of the bit stream adjuster, the generated PDM bit stream at the selected PDM clock phase to produce the truncated or extended PDM bit stream.

17. The modulation method of claim 15, wherein the bit stream adjuster operates at a frequency that is less than or equal to a frequency of the pulse density modulator.

* * * * *